United States Patent [19]
Gupta

[11] Patent Number: 5,313,474
[45] Date of Patent: May 17, 1994

[54] METHOD AND APPARATUS TO DETERMINE THE LOG OF AN ELEMENT IN $GF(2^m)$ WITH THE HELP OF A SMALL ADJUSTABLE SIZE TABLE

[75] Inventor: Alok Gupta, Irvine, Calif.

[73] Assignee: QLogic Corporation, Costa Mesa, Calif.

[21] Appl. No.: 736,461

[22] Filed: Jul. 26, 1991

[51] Int. Cl.⁵ ............................................. G06F 11/10
[52] U.S. Cl. .................................................. 371/37.1
[58] Field of Search ..................... 371/37.1, 37.8, 43

[56] References Cited

U.S. PATENT DOCUMENTS

| | | | |
|---|---|---|---|
| 4,498,175 | 2/1985 | Nagumo et al. | 371/37.5 |
| 4,597,083 | 6/1986 | Stenerson | 371/37.2 |
| 4,769,818 | 9/1988 | Mortimer | 371/37.4 |
| 4,868,827 | 9/1989 | Yamada et al. | 371/37.5 |

Primary Examiner—Charles E. Atkinson
Attorney, Agent, or Firm—Spensley Horn Jubas & Lubitz

[57] ABSTRACT

A system for determining the log of an element in Galois field $GF(2^m)$ using a small, selectable size table, a finite field multiplier, and a counter. The system allows for a flexible trade-off between speed and integrated circuit area, and applies for any $GF(2^m)$ for all possible m. The system allows for on-the-fly error location determination without the need for storing all possible logs for the $GF(2^m)$ under consideration.

12 Claims, 1 Drawing Sheet

METHOD AND APPARATUS TO DETERMINE THE LOG OF AN ELEMENT IN GF($2^m$) WITH THE HELP OF A SMALL ADJUSTABLE SIZE TABLE

RELATED APPLICATION

The present application is related to U.S. patent application Ser. No. 07/736,096, filed Jul. 26, 1991, entitled METHOD AND APPARATUS FOR LOCATING ERRORS IN DATA, filed on even date herewith and having the same inventor as the present application. This co-pending application is incorporated by reference in its entirety.

BACKGROUND OF THE INVENTION

1. Field of the Invention

The present invention is directed to error correcting systems which utilize an error correcting code to correct errors which have occurred in the transmission or storage of information. The present invention provides a method and apparatus for determining the log of an element in the Galois Field GF($2^m$). More particularly, the present invention is directed to a method and apparatus for determining the log of an element in GF($2^m$) with the help of a small table of selectable size which applies for any GF($2^m$) and any value of m.

2. Related art

In Galois Field GF($2^m$), elements are primarily represented in two different forms: vector form and power form. In vector form, each element of the Galois Field is represented by a polynomial of degree $m-1$ or less which has coefficients from the binary field (i.e., 0 or 1). In power form, all elements of the Galois Field (except the zero element) are represented by powers of a primitive element of the Field.

For purposes of convenience and high speed processing, elements in GF($2^m$) are generally represented in vector form. All operations such as addition, multiplication, division, etc., are performed in vector form using special purpose hardware.

When performing error detection and correction, and more particularly during the associated decoding process, after error location numbers are obtained in vector form, it is necessary to find the log of the error location vector in order to determine the error location within the length of the codeword containing the error. To illustrate, if a is a primitive element in GF($2^m$), and if $a^k$ represents an error location vector, then:

$$a^k = a_{m-1}x^{m-1} + a_{m-2}x^{m-2} + \ldots + a_0$$

and $$\log[a^k] = \log[a_{m-1}x^{m-1} + a_{m-2}x^{m-2} + \ldots + a_0] = k$$

where k represents the location of an error in the codeword.

In order to provide for on-the-fly (i.e., in real-time) error correction, the prior art teaches that a log table must be implemented on an integrated circuit chip. This is true even if the chip is provided with special purpose fast multipliers and inverters. Such a table requires a ROM table of size $2^m * m$, which can be quite expensive for large values of m.

Therefore, it would be desirable to provide an alternative method and apparatus for determining the log of an element in GF($2^m$) that provides for on-the-fly error correction and is inexpensive to implement.

SUMMARY OF THE INVENTION

The present invention provides a method and apparatus for determining error locations from error location vectors which eliminates the need for the large ROM table required in the prior art. In particular, the present invention is able to determine the log of an element in Galois field GF($2^m$) with the help of a small table of selectable size which is suitable for on-the-fly error correction. The invention is particularly suited for use with error correcting systems employing Reed-Solomon or BCH codes in disk storage or communication systems. However, it should be understood that the invention is not limited to use with such systems.

In accordance with the present invention, a table is used which is much smaller than that required by the above-described direct table implementation method. The table, which is preferably implemented in the form of a combinatorial logic circuit formed with a Programmable Logic Array (PLA) circuit or a Programmable Array Logic (PAL) circuit, but which may also be in the form of a ROM or any other suitable memory device, stores the logarithms of a range of elements in GF($2^m$).

The table is checked to determine if the log of the particular GF($2^m$) element under consideration is present in the table. If the log is found in the table, it is output and the process is complete.

If the log of the particular GF($2^m$) element under consideration is not located in the table during a first check (i.e., it is outside of the stored range), the element is processed in an attempt to bring it within the range of the logarithms stored in the table. This processing involves reducing the power of the element under consideration by the number of elements stored in the table. The table is then checked again to see if it contains the log of the processed element. If the log is still not found, this process is repeated until the logarithm of the processed element is found. Since the log found will be that of the processed element, it will have to be adjusted in order to arrive at the log of the original element under consideration. The adjustment is performed by concatenating the output of a simple counter with at least a portion of the output of the table.

With the present invention, only a small range of logarithms needs to be stored in the table. If the log of an element is not found, minimal processing (e.g., a single multiplication) is required to adjust the element under consideration and allow another check of the table. This processing requires a relatively small amount of time, especially in light of the ability to greatly reduce the size of the logarithm table.

The present invention will be more fully explained in conjunction with the following figures which are to be considered as merely illustrative of the present invention. It should be understood that the present invention is not limited to the illustrated embodiments and that numerous modifications of such embodiments are possible without departing from the spirit and scope of the present invention.

DETAILED DESCRIPTION OF THE INVENTION

Throughout this description, the preferred embodiment and examples shown should be considered as exemplars, rather than limitations on the structure and method of the present invention.

Figure 1:
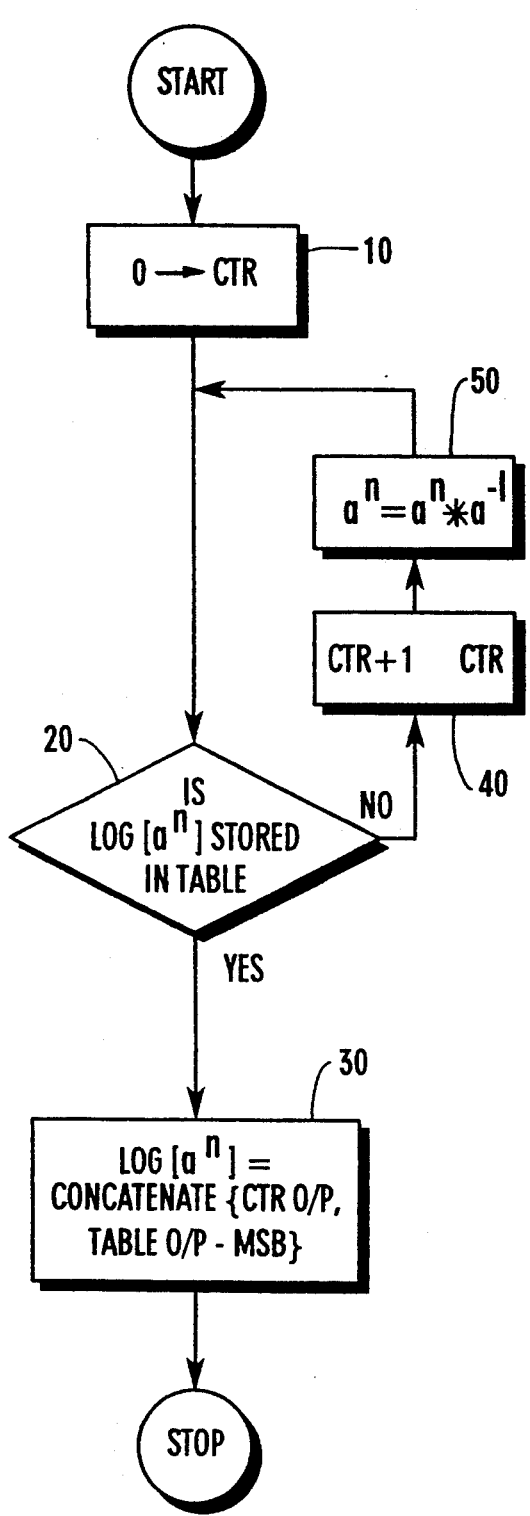
FIG. 1 shows a flow diagram of one embodiment of the present invention.

FIG. 1 illustrates a flow diagram of the method for determining a log of an element of the $GF(2^m)$ in accordance with a preferred embodiment of the present invention. For example, to determine the log of $a^n$ where $a^n$ is given in vector form and $0 \leq n \leq (2^m - 1)$ (i.e., the number of elements for which a log can be found), the method is as follows:

Step 10: A counter (CTR) is set to 0 (or to any preselected constant value).

Step 20: A table of pre-computed logarithm values is addressed in known fashion to determine if log $[a^n]$ is stored in the table.

Step 30: If log $[a^n]$ is found in the table, then the output of the counter (CTR O/P) is concatenated with the output of the table (TABLE O/P) (exclusive of the most significant bit of the TABLE O/P in the preferred embodiment, for reasons explained below) to produce the log output; processing is then terminated. (The counter output is first decremented by the preselected constant value if a non-zero value was used).

Step 40: If log $[a^n]$ is not located in the table, the counter CTR is incremented by 1.

Step 50: $a^n$ is replaced with $a^n * a^{-1}$ (where 1 is defined as described below) and the process proceeds back to step 20 again.

The process repeats steps 20, 40, 50 until a match is found in the table, and then the log is output in step 30.

The more log values stored in the table, the better the chance will be for a match during the table look-up and consequently the faster the processing speed. However, as discussed above, one of the advantages of the present invention is the ability to have a smaller log table for look-up purposes compared to the prior art.

The size of the table is chosen depending on the particular use of the system, and will reflect a compromise between speed and integrated circuit area. While a larger table will result in greater processing speed, a larger table utilizes more integrated circuit area and increase costs of production. The size of the table is described by the following equation:

$$\text{Size} = m * 1 * (k+1) \tag{1}$$

where $1 = 2^k$, $k < m$. Equation (1) describes a table having an m-bit input as the address which stores 1 words of $k+1$ bits each, where k is the size each log value. The variable l, which is selected by the user, determines the size of the table and hence the resulting speed of the algorithm. Thus, l must be chosen to balance the need for system speed against available integrated circuit area.

Figure 2:
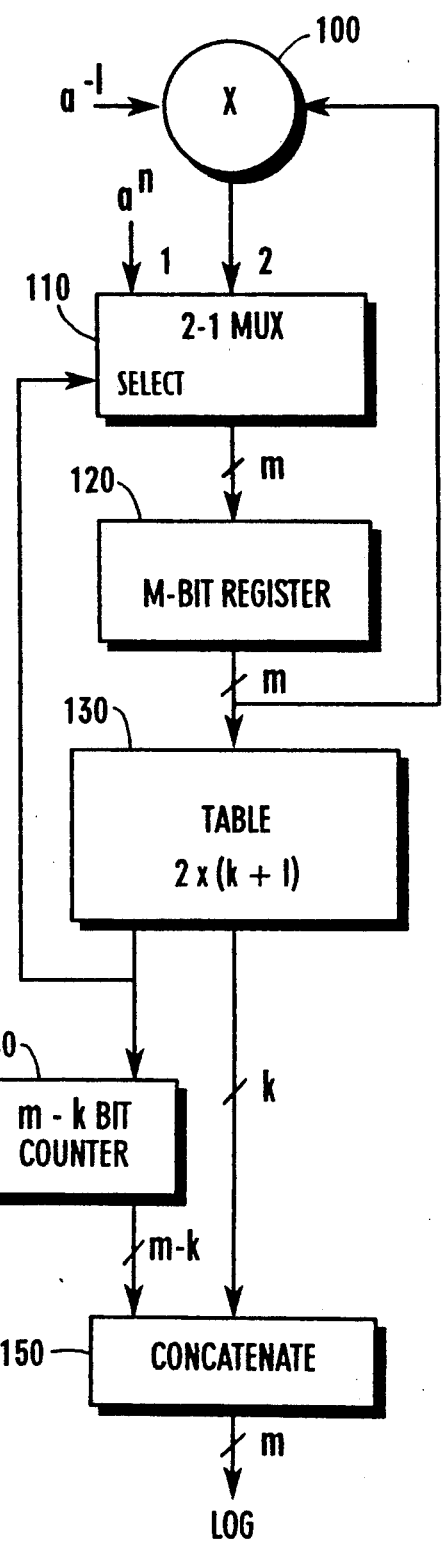
FIG. 2 is a block diagram of a circuit for performing the method illustrated in FIG. 1.

FIG. 2 shows a circuit for implementing the method illustrated in FIG. 1. A multiplexer (MUX) 110 receives the vector $a^n$ (i.e., the element under consideration) on a first input 1 and the output of a finite field multiplier 100 on a second input 2. The MUX 110 is controlled to initially pass the first input 1 to an m-bit address register 120. After passing the first input 1 through, the MUX 110 is controlled to continually pass the second input 2 to the m-bit address register 120 until the log of $a^n$ is found.

The m-bit address register 120 is used to address the table 130. The table 130 stores the pre-computed log values of elements from the set $\{a^0, a^1, \ldots, a^{l-1}\}$. Since $1 = 2^k$, once l has been chosen, by definition this will determine the size of k. While the table may be implemented using a ROM or a RAM, the preferred embodiment of the present invention utilizes a PLA, PAL, or a combinatorial logic circuit to provide the table 130.

Since there are m address bits but only l (i.e., $2^k$) words stored in the memory, the table 130 will need to be able to discriminate the address applied by the m-bit register 120 and provide a valid output only for a valid input address. For an invalid input address, the table provides a selected output (e.g., the most significant output bit of the table will be 1 and the remaining bits will be 0's) to provide a flag to the system that the log for that particular address is not in the table 130. Such a condition would arise when the log of the element $a^n$ under consideration is not present in table 130.

When the input address from the address register 120 is not a valid input address, the address is fed to a finite field multiplier 100 where it is multiplied by $a^{-l}$. This effectively reduces the input address by a value equal to the number of logarithm values stored in the table 130. The modified address is then applied to table 130 through the MUX 110 and the address register 120. At the same time, the counter 140 is incremented by 1. If the output of the table 130 in response to the modified address is still equal to the selected output value signifying an invalid input address, the process is repeated until the output of the table is a valid output.

In the preferred embodiment of the invention, the finite field multiplier 100 is a combinatorial circuit consisting of approximately $m^2/4$ exclusive-OR gates. The configuration of such a multiplier is conventional and well-known. Examples of finite field multipliers that may be adapted for use with the present invention are described in U.S. Pat. Nos. 4,958,348; 4,841,300; 4,777,635; and 4,216,531, the teachings of which are incorporated by reference.

Essentially, a user customizes the system by determining the size of the table 130. Since the table 130 can be created using, for example, a PLA, it is easy to produce a table based on the needs of the system. In a situation where, for example, m = 8 and l is chosen to be 16, k will equal 4. The table 130 will then have 8 address inputs and store 16 logarithm values of 4 bits each. The table also includes an extra bit (preferably the most significant bit, or MSB) which is used as a check bit to indicate the validity of the output. In this example, since m = 8, there are 255 possible elements for which a logarithm may have to be determined. The table 130 will store logarithm values for the first 16 elements, or $\{a^0, a^1, \ldots, a^{l-1}\}$. For any n greater than $(l-1)$, the system will have to process the input $a^n$ in order to bring it within the range of the logarithm values stored in the table. Thus, if in this example n = 25, the initial addressing of the table 130 will result in an invalid output since $n > (l-1)$. Since an invalid output is obtained from the table (e.g., the output is the flag value of 10000), $a^{25}$ is multiplied by $a^{-16}$ in the finite field multiplier 100. The output of the finite field multiplier 100 (i.e., $a^9$), is then fed to the address register 120 where it will be used to address the table 130. Since the new address falls within the range of the logarithm values stored in the table 130, the output will be valid.

The output of the table 130, exclusive of the MSB, is then concatenated in device 150 with the output of the counter 140, which will equal 1 in this example since one multiplication occurred. The concatenation device 150 may be, for example, a clocked parallel-in/parallel-out register or other temporary storage device. As discussed above, the most significant bit (MSB) of the table output is used as a check bit to indicate the validity of the table output. Therefore, it is not incorporated into the log output bits (i.e., the first k bits of the table output) which are passed to the concatenation device 150.

The concatenated output equals the log of $a^{25}$. Since the log of $a^n$ is simply n, the m−k bit counter 140 supplies the necessary bits for the logs of any $a^n$ where n is greater than the range of values stored in the table 130. During the initial check of the table 130 with the original $a^n$ input, the counter 140 will have a value of zero and hence there will be no adjustment of the table 130 output.

Suitable clocking and gating circuitry, not shown, controls the operation of the circuit shown in FIG. 2. In particular, the value of the MSB flag from the table 130 may be used to control switching of the MUX 110 and incrementing of the counter 140. For example, a value of 1 for the MSB can be used to switch the MUX 110 to pass the second input 2 and increment the counter 140.

In the above example, the direct implementation of the log table in accordance with the prior art would require a 256×8 bit ROM. In accordance with the present invention where l=16 and k=4, the size of the new table required is only 16*5 bits. In addition, the invention requires a simple 4-bit counter and approximately $m^2/4$ (16, in this example) exclusive-OR gates to build the finite field multiplier 100 to perform the multiplication with $a^{-16}$.

In an alternative embodiment, there is no need to provide a dedicated counter 140 and finite field multiplier 100 to be used with the table 130. The multiplication can be performed using a general purpose multiplier on chip. Similarly, the m−k bit counter 140 and address register 120 can be shared circuitry and need not be dedicated solely to determining the log of an element in conjunction with the table 130. Thus, the present invention only requires a dedicated table 130, which in the above example would be 16×5 bits (as opposed to 255×8 bits in the prior art). It is therefore clear that the total integrated circuit area required to implement the inventive method is considerably less than the area required by the direct table implementation. Further, the savings in area would be considerably larger for a Galois Field GF($2^m$) with m>8.

In the worst case, the determination of the log of an element in Galois field GF($2^m$) in accordance with the present invention will require 15 finite field multiplications for m=8 and k=4. If the log table 130 is to be used only to find the error location numbers, the worst case time still allows for on-the-fly error location determination. However, should it be determined that more speed is required, by simply increasing the size of the table, the maximum number of multiplications will decrease and speed will increase, thus reducing the worst case time.

A number of embodiments of the present invention have been described. Nevertheless, it will be understood that various modifications may be made without departing from the spirit and scope of the invention. For example, while concatenation is the preferred method of combining the output of the counter 140 and the table 130, combining the two outputs by addition can be used where the counter 140 output is shifted k bits to the left before adding the table output 130; this has the same effect as concatenation. Further, other means may be used to flag that an address does not correspond to an entry in the table 130, thus reducing the size of each entry from k+1 bits to only k bits. Accordingly, it is to be understood that the invention is not to be limited by the specific illustrated embodiment, but only by the scope of the appended claims.

I claim:

1. A method for determining the logarithm of a predetermined element of a Galois field GF($2^m$) utilizing a table stored in a device, the table having a plurality of logarithm values for a predetermined range of the GF($2^m$) elements stored therein, the predetermined element having a power n such that $0 \leq n \leq (2^m - 1)$, the method comprising the steps of:
   a. initializing a counter to a preset value;
   b. using the predetermined element as an address to the table, wherein the table produces (1) a first predetermined output if the predetermined element is not a valid address to the table and (2) a second predetermined output if the predetermined element is a valid address to the table;
   c. if the output from the table is the first predetermined output, then:
      i. incrementing the counter;
      ii. reducing the power of the predetermined element by an amount equal to the number of logarithm values stored in the table; and
      iii. returning to step b;
   d. if the output from the table is the second predetermined output, then:
      i. combining the value of the counter with at least a portion of the output of the table to produce a combined output, wherein the combined output is the logarithm of the predetermined element.

2. The method of claim 1, wherein the step of combining the value of the counter with at least a portion of the output of the table comprises concatenation.

3. The method of claim 1, wherein the counter is initialized to a preset value of zero.

4. The method of claim 1, wherein the number l of logarithm values stored in the table is $l=2^k$, where k<m, m is the width of the predetermined element used to address the table, and k is the size of each log value.

5. The method of claim 1, wherein each table entry has k+1 bits, where k is the size of each log value, and the extra bit in each table entry has a first value if the predetermined element is not a valid address to the table and a second value if the predetermined element is a valid address to the table 6. The method of claim 5, wherein the size of the table in bits is m*l*(k+1), where $l=2^k$, k<m, m is the width of the predetermined element used to address the table, and l is the number of table entries stored in the table.

7. An apparatus for determining the logarithm of a predetermined element of a Galois field GF($2^m$) utilizing a table stored in a device, the table having a plurality of logarithm values for a predetermined range of the GF($2^m$) elements stored therein, the predetermined element having a power n such that $0 \leq n \leq (2^m - 1)$, the apparatus comprising:
   a. a counter having an initial value therein;

b. means for addressing the table utilizing the predetermined element as an address, wherein the table produces (1) a first predetermined output if the predetermined element is not a valid address to the table and (2) a second predetermined output if the predetermined element is a valid address to the table;
c. means, responsive to the first predetermined output, for incrementing the counter;
d. means, responsive to the first predetermined output, for adjusting the power of the predetermined element by the an amount equal to the number of logarithm values stored in the table;
e. means for feeding back the adjusted predetermined element to the means for addressing, wherein the means for addressing utilizes the adjusted predetermined element as an address to the table and wherein the means for incrementing, the means for adjusting, and the means for feeding back continue to respond to the first predetermined output until a second predetermined output is produced in response to an adjusted predetermined element;
f. means, responsive to the second predetermined output from the table, for combining the value of the counter with at least a portion of the second predetermined output, to produce a combined output, wherein the combined output is the logarithm of the predetermined element.

8. The apparatus of claim 7, wherein the means for combining concatenates the value of the counter with at least a portion of the output of the table.

9. The apparatus of claim 7, wherein the counter is initialized to an initial value of zero.

10. The apparatus of claim 7, wherein the number l of logarithm values stored in the table is $l=2^k$, where $k<m$, m is the width of the predetermined element used to address the table, and k is the size of each log value.

11. The apparatus of claim 7, wherein each table entry has $k+1$ bits, where k is the size of each log value, and the extra bit in each table entry has a first value if the predetermined element is not a valid address to the table and a second value if the predetermined element is a valid address to the table.

12. The apparatus of claim 11, wherein the size of the table in bits is $*l*(k+1)$, where $l=2^k$, $k<m$, m is the width of the predetermined element used to address the table, and l is the number of table entries stored in the table.

* * * * *